United States Patent
Wang et al.

(10) Patent No.: US 12,341,535 B2
(45) Date of Patent: Jun. 24, 2025

(54) ANALOG FORWARD ERROR CORRECTION

(71) Applicant: Intel Corporation, Santa Clara, CA (US)

(72) Inventors: Hechen Wang, Portland, OR (US); Andrey Belogolovy, Hillsboro, OR (US); Richard Dorrance, Hillsboro, OR (US); Deepak Dasalukunte, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 594 days.

(21) Appl. No.: 17/552,409

(22) Filed: Dec. 16, 2021

(65) Prior Publication Data

US 2023/0198550 A1 Jun. 22, 2023

(51) Int. Cl.
*H03M 13/00* (2006.01)

(52) U.S. Cl.
CPC .... *H03M 13/6597* (2013.01); *H03M 13/6544* (2013.01)

(58) Field of Classification Search
CPC .................................................. H03M 13/6597
See application file for complete search history.

(56) References Cited

U.S. PATENT DOCUMENTS

| | | | |
|---|---|---|---|
| 2010/0267378 A1* | 10/2010 | Hamabe | H04W 36/305 455/423 |
| 2012/0140702 A1* | 6/2012 | Takano | H04L 5/0037 370/315 |
| 2016/0080956 A1* | 3/2016 | Hoole | H04B 1/1027 455/423 |

OTHER PUBLICATIONS

M. Chen et al., "An improved decoding algorithm based on minmax for NB-LDPC codes", 2017 36th Chinese Control Conference (CCC), Jul. 26-28, 2017, 6 pages, IEEE, Dalian, China.
V. Savin, "Min-Max decoding for non binary LDPC codes", 2008 IEEE International Symposium on Information Theory, Jul. 6-11, 2008, 5 pages, IEEE, Toronto, Canada.
G. Wang et al., "Parallel nonbinary LDPC decoding on GPU", 2012 Conference Record of the Forty Sixth Asilomar Conference on Signals, Systems and Computers (Asilomar), Nov. 4-7, 2012, 5 pages, IEEE, Pacific Grove, CA, USA.
J. Lin et al., "An Efficient Fully Parallel Decoder Architecture for Nonbinary LDPC Codes", IEEE Transactions on Very Large Scale Integration (VLSI) Systems, Dec. 18, 2013, p. 2649-2660, IEEE, vol. 22, Issue: 12.
A. Das et al.; "A Single Error Correcting Code with One-Step Group Partitioned Decoding Based on Shared Majority-Vote"; https://www.mdpi.com/2079-9292/9/5/709; Electronics 2020; Published on Apr. 26, 2020; 14 pages; vol. 9; Issue: 5.

(Continued)

*Primary Examiner* — Joseph D Torres
(74) *Attorney, Agent, or Firm* — Viering, Jentschura & Partner mbB (57) ABSTRACT

A wireless communication device, including a radiofrequency frontend, configured to wirelessly receive a radiofrequency signal; perform one or more analog baseband operations on the received radiofrequency signal, according to a radio access technology; and output an analog signal representing an output of the analog baseband operations on the received radiofrequency signal; an error corrector, configured to perform an error correction operation on the analog signal; and output an error corrected signal in analog domain; and the analog-digital converter, configured to convert the error corrected signal to digital domain.

24 Claims, 8 Drawing Sheets

(56) References Cited

OTHER PUBLICATIONS

J. Hagenauer et al., "Decoding and equalization with analog non-linear networks", European Transactions on Telecommunications (ETT), Oct. 1999, 22 pages.
H.-A., Loeliger, "Analog decoding and beyond", Proceedings 2001 IEEE Information Theory Workshop, Sep. 2-7, 2001, p. 126-127, IEEE, Cairns, QLD, Australia.
S. Hemati et al., "Convergence Speed and Throughput of Analog Decoders", IEEE Transactions on Communications, May 15, 2007, p. 833-836, IEEE, vol. 55, No. 5.
M. Gu et al., "A 100 pJ/bit, (32,8) CMOS Analog Low-Density Parity-Check Decoder Based on Margin Propagation", IEEE Journal of Solid-State Circuits, Jul. 2011, p. 1433-1442, IEEE, vol. 46, No. 6.
I. B. Djordjevic et al., "LDPC codes and stochastic decoding for beyond 100 Gb/s optical transmission", 2008 34th European Conference on Optical Communication, Sep. 21-25, 2008, p. 139-140, Brussels.
Z. Zhao et al., "Design, Simulation, and Implementation of a CMOS Analog Decoder for (480,240) Low-Density Parity-Check Code", IEEE Access, Aug. 21, 2017, p. 17381-17391, vol. 5.

\* cited by examiner

ANALOG FORWARD ERROR CORRECTION

TECHNICAL FIELD

Various aspects of this disclosure generally relate to analog circuits for forward error correction, such as in wireless communication.

BACKGROUND

As cellular standards evolve, data rates tend to increase. Such increasing data rates, although often desirable, are closely correlated with increased power consumption. For example, as the 5th Generation Technology Standard (5G) of the 3rd Generation Partnership Project (3GPP) is implemented, and owing to 5G's significant increase in data speeds as compared to previous generations of wireless communication, 5G's power consumption may be approximately 100% higher than that under radio access technologies according to the 4th Generation Partnership Project (4G).

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary embodiments of the disclosure are described with reference to the following drawings, in which.

DESCRIPTION

The following detailed description refers to the accompanying drawings that show, by way of illustration, exemplary details and embodiments in which aspects of the present disclosure may be practiced.

The word "exemplary" is used herein to mean "serving as an example, instance, or illustration". Any embodiment or design described herein as "exemplary" is not necessarily to be construed as preferred or advantageous over other embodiments or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements] ") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

With advances in microprocessors, the trend has been to increasingly implement functions in the digital realm. Analog computing has thus largely fallen out of favor. Nevertheless, analog computing has potential for greater energy efficiency and greater area efficiency in certain aspects of wireless communication than its conventional digital counterparts.

Herein are disclosed approaches to implement soft decision forward error correction in the analog domain, prior to digitization, such as for wireless communication. Although primarily described herein with respect to telecommunications, it is expressly noted that the principles, devices, and methods disclosed may also be readily applied to multi-level memory cell storage.

The analog signal processing based soft decision FEC disclosed herein may result in increased power efficiency and hardware efficiency compared to conventional digital solutions. Furthermore, using the analog pre-processing disclosed herein, the analog/digital converter (ADC) can be placed after the FEC block, which significantly reduces design complexity. Moreover, the approaches disclosed herein include FEC decoders that use building blocks (e.g. such as absolute value, min-search, multipliers using C-2C ladders, etc.), which are modular in design and can thus simplify the efficient implementation of various kinds of FEC codes.

Figure 1:
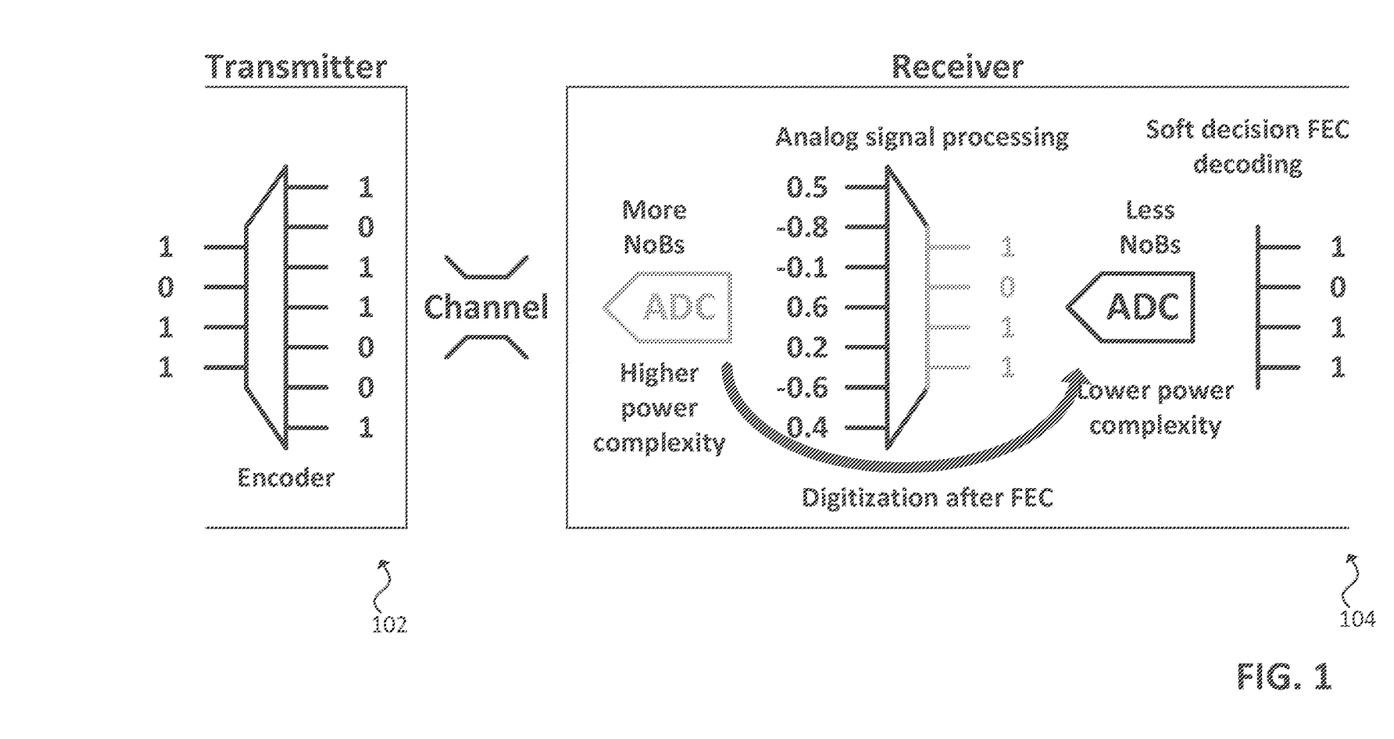
FIG. 1 depicts a generalized analog FEC configuration.

FIG. 1 depicts a generalized analog FEC configuration. In this figure, a transmitter 102 sends a radiofrequency signal representing data. The receiver 104 receives the radiofrequency signal on one or more antennas (not pictured) and performs one or more baseband operations in the analog domain, and thus before the analog/digital converter (ADC). Although the receiver is conventionally configured to convert the received RF signal from analog to digital before the FET occurs, this exemplarily receiver depicts the ADC being moved from before the FEC to after the FEC, thereby requiring the FET to be performed in the analog domain.

Forward error correction (FEC) is essential for modern wireless communication. There are principally two categories of FEC: hard-decision FEC and soft decision FEC. Although soft decision FEC can generally provide better performance in wireless communication, it requires a great number of bits and higher oversampling rates for its ADC. This tends to result in extremely complicated designs with unacceptable power consumption. For at least this reason, the ADC is often understood as one of the bottlenecks in implementation of soft decision FEC. Using analog signal processing, however, soft decision FEC can be processed in the analog domain. As a result, the ADC can be placed after the FEC with relaxed design specifications.

Low-Density Parity-Check (LDPC) codes are a popular class of FEC codes that are used in wireless communication systems. Their high decoding complexity, however, is a significant drawback to their application in many systems. In a wireless transceiver, the FEC module can require as much as 50% of the silicon area and power. Several popular algorithms for LPDC decoding exist, including MIN-SUM, MIN-PRODUCT, and MIN-MAX.

Most LPDC accelerators that seek to achieve improved energy efficiency do so by introducing quantization (power and complexity increases quadratically with the number of bits) and various mathematical approximations to try and achieve better parallelization. In the analog domain, however, significantly higher bit precisions can be represented in a continuous voltage domain as compared to digital systems. Similarly, some of the major computational bottlenecks in digital implementations of these FEC algorithms (MIN, MAX, MAC, SUM, MULT, etc. . . . ) are trivially implementable in the charge or time-domains with simple logic gates. Efficient analog implementations of these mathematical kernels are covered in the following sections.

Analog Implementation Friendly Soft Decision Forward Error Correction Algorithm

The following describes a categorization of basic operations for soft decision FEC procedures. FEC procedures can generally be grouped into: (1) parity check, (2) soft decision weight generation, and (3) majority voting. Parity checks can be realized with polarity multiplication or XNOR gate. Soft decision weight generation can be represented as the finding of a minimum of a group of absolute values. Majority voting can be performed using multiply-accumulate (MAC) operations.

Figure 2:
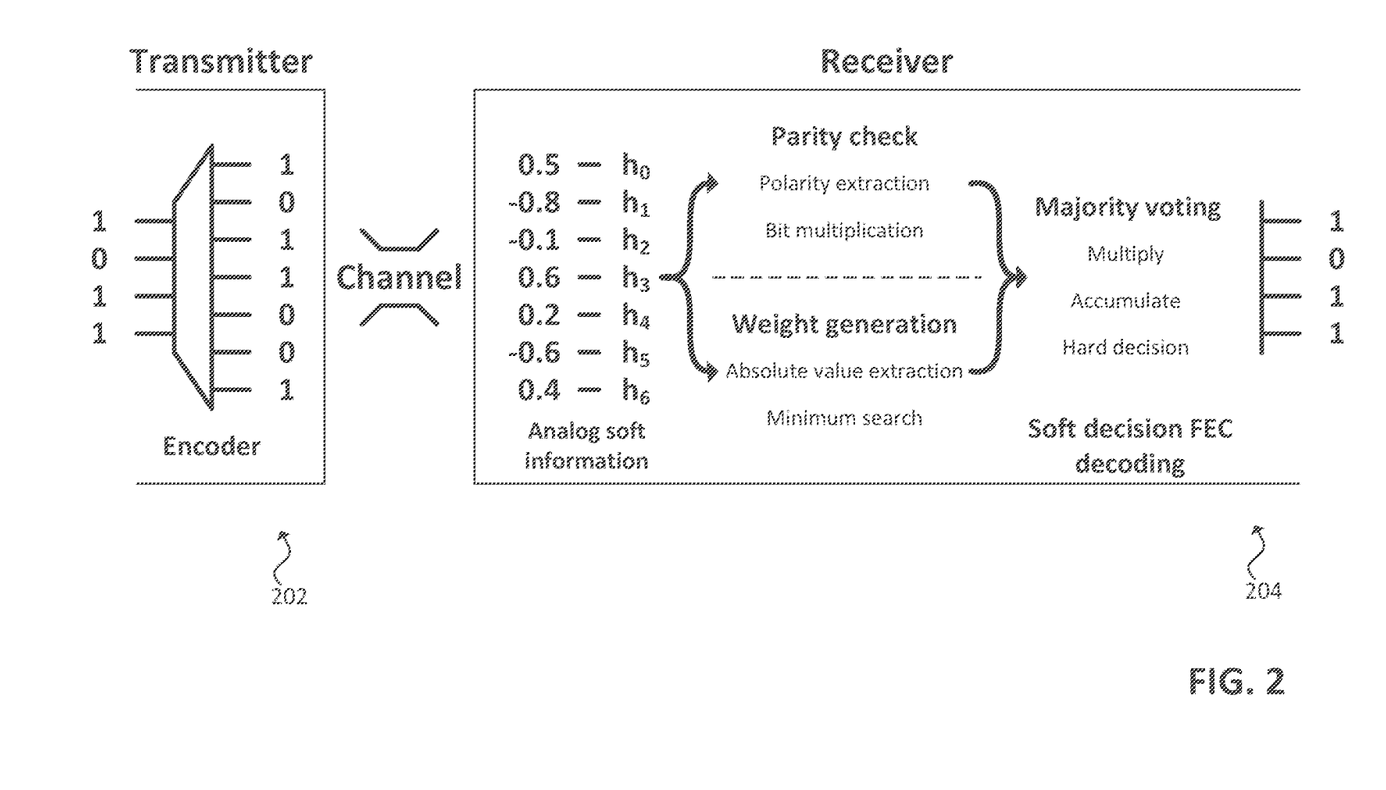
FIG. 2 depicts an illustration of a soft decision FEC with a summary of the required operations.

FIG. 2 depicts an illustration of a soft decision FEC with a summary of the required operations. In this image, a transmitter 202 sends a radiofrequency signal representing data. The receiver 204 receives the radiofrequency signal on one or more antennas (not pictured) and performs one or more baseband operations in the analog domain, and thus before the analog/digital converter. In this case, the one or more baseband operations include FEC, which itself includes a polarity check, weight generation, and majority voting. The polarity check is implemented using a polarity extraction procedure and a bit multiplication. The weight generation is implemented using absolute value extraction and minimum search. The majority voting is implemented using multiplication, accumulation, and hard decision. In summary, the operations needed in soft decision FEC are polarity extraction, 1-bit multiplication or XNOR logic, absolute value extraction, minimum (or maximum) value finding, and multibit MAC operation. Each of these can be processed directly in the analog domain using the principles and/or devices disclosed herein.

Polarity Extraction and Hard Decision

Figure 3:
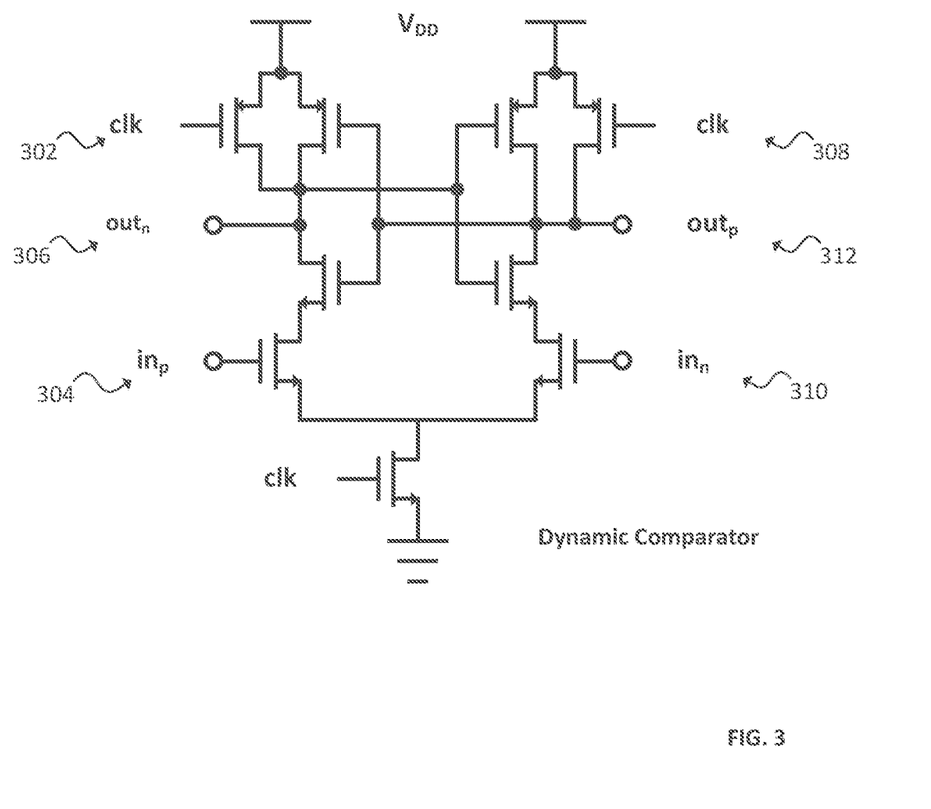
FIG. 3 depicts an exemplarily analog polarity extractor.

FIG. 3 depicts an exemplarily analog polarity extractor, which is a kind of cross-coupled comparator including a first side and a second side. The first side includes a clock signal input 302, a positive input 304 and a negative signal output 306. The second side includes a block signal input 308, a negative input 310 and a positive output 312.

Because the signal from the analog baseband is real-valued, it can be either positive or negative. The dynamic comparator depicted in FIG. 3 may determine signal's polarity in the analog domain (e.g. without digitization). In analog domain, VDD/2 voltage is defined as zero. Any voltage above VDD/0 may be defined as being positive, whereas any voltage below VDD/2 may be defined as being negative. The comparator determines the difference between the input signal and the reference zero, which is VDD/2 and will output a result of the comparison.

If the analog signal from the analog baseband is a differential signal, then the two ends must be connected to the ports $in_p$ and $in_n$, respectively. If the signal is single ended, then the input signal will be received at one of ports $in_p$ and $in_n$, and the other of ports $in_p$ and $in_n$ will be connected to a voltage potential of VDD/2.

Bit Multiplication

Figure 4:
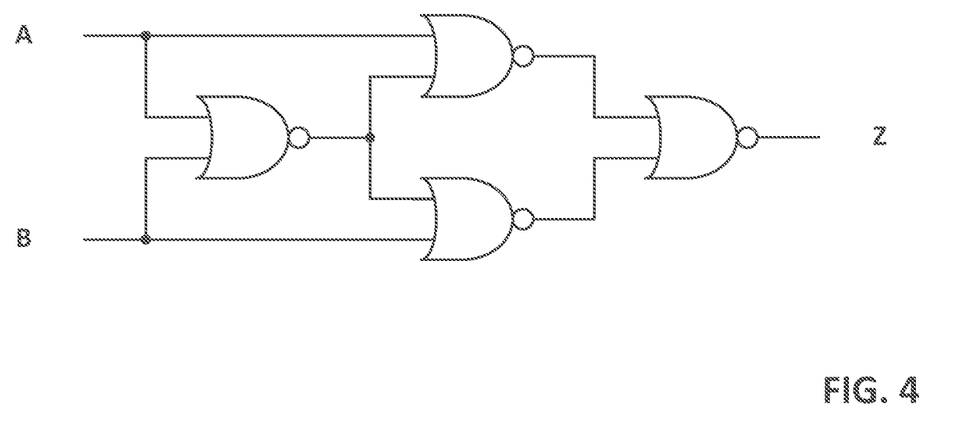
FIG. 4 depicts a CMOS-based XNOR circuit schematic for bit multiplication.

FIG. 4 depicts a CMOS-based XNOR circuit schematic for bit multiplication. A simple approach for realizing bit multiplication is to use one or more XNOR logic gates, which are configured in FIG. 4 as a circuit of four NOR gates. The bit multiplier receives the output from the comparator, which can provide a voltage swing, which is analogous to a digital signal in that the comparator's output will be either high or low. Therefore, it is possible to simply connect the output of the comparator to the conventional CMOS XNOR gates of FIG. 4 to perform the bit multiplication. Otherwise stated, when using XNOR for bit multiplication, +1 may be mapped to logic High, and −1 may be mapped to logic Low.

However, the XNOR gate depicted in FIG. 4 is not the most efficient solution for realizing bit multiplication in the analog realm. Rather, a much greater efficiency can be realized with a customized XNOR logic design.

Figure 5:
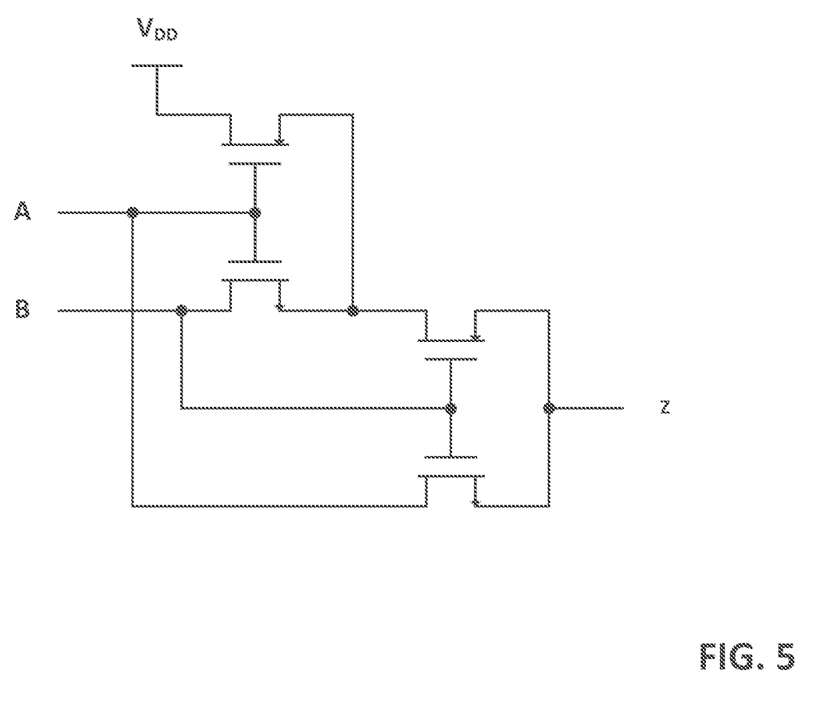
FIG. 5 depicts an alternative XNOR circuit schematic for bit multiplication.

FIG. 5 depicts an alternative XNOR circuit schematic for bit multiplication. In this figure, four transistors are configured into a circuit that receives inputs A and B and outputs Y according to an XNOR logic. Because each of the four NOR gates in FIG. 4 requires multiple transistors to be realized, the four-transistor XNOR circuit of FIG. 5 may be produced at a lower expense and/or with less difficulty than using a conventional NOR-based XNOR structure.

Absolute Value Extraction

Figure 6:
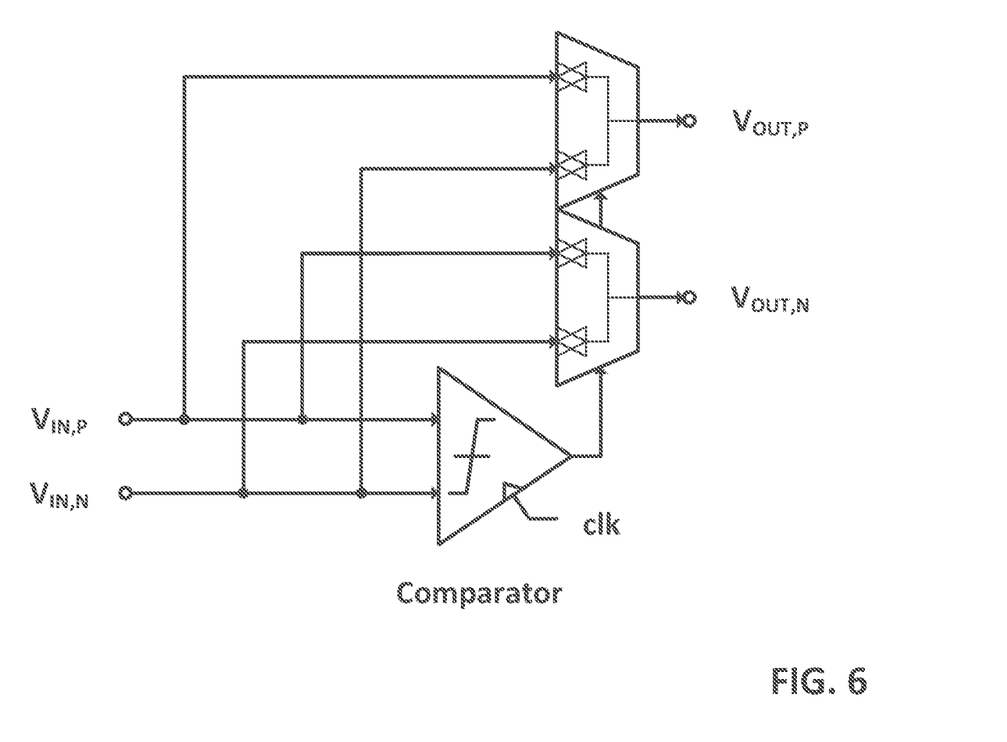
FIG. 6 depicts an analog implementation of the absolute value extraction.

FIG. 6 depicts an analog implementation of the absolute value extraction. The circuit includes a dynamic comparator and a transmission-gate-based analog multiplexer (MUX). The output of the comparator controls the selection node of the analog MUX. If the input signal, VIN, is greater than a reference signal, the MUX will let the input signal connect to the output. Otherwise, the output of the MUX will be tied to the opposite nodes. This analog implementation of absolute value extraction requires less hardware and power when compared with its digital counterpart. By way of comparison, the comparable digital solution requires a group of registers (the register amount corresponds to the data bit-length) to buffer the digital data coming to the module before sending the data to the digital MUX. Although the on-chip area of an analog comparator is comparable to that of a digital register, it is much smaller than a group of digital registers.

Minimum Search

The implementation of the minimum value search can be complicated in the digital domain, such as when the number of items is large. In the analog domain, however, or particularly in time domain, there is an ultra-efficient approach to realize a minimum value search.

Figure 7:
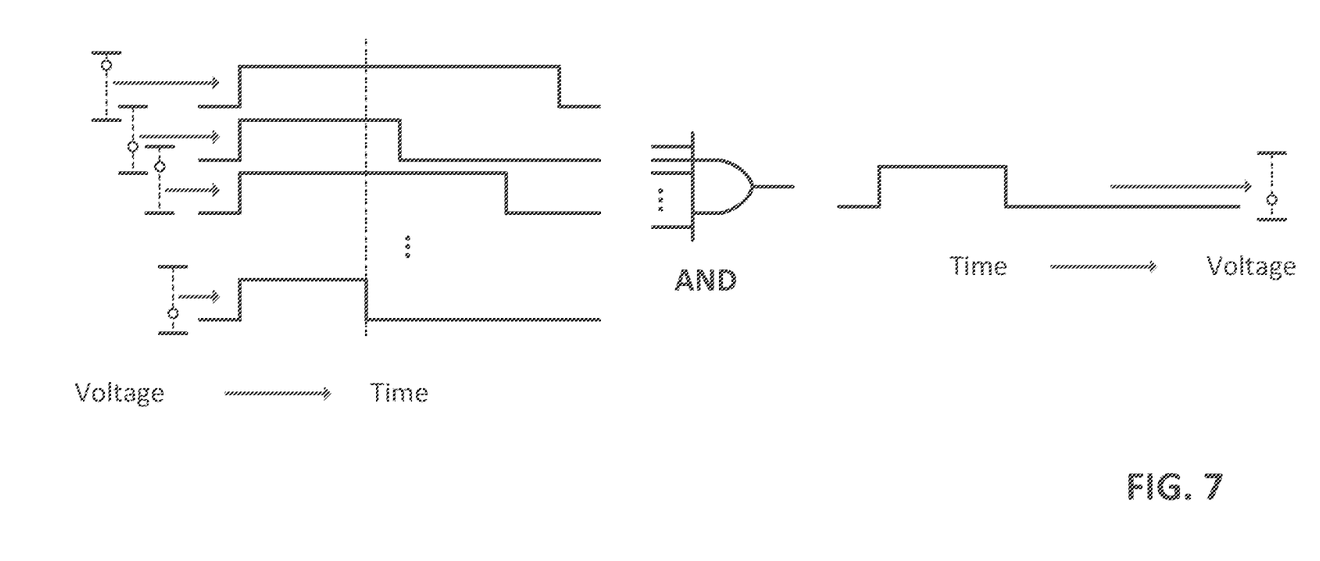
FIG. 7 depicts an analog implementation of minimum value search.

FIG. 7 depicts an analog implementation of minimum value search, according to an aspect of the disclosure. This analog circuit relies on multiple voltage-to-time converters connected to an AND-gate, the output of which is the shortest input. Voltage-to-time converters are known in the art, and any known voltage-to-time converter may be used in this circuit. In an exemplary implementation, capacitors may be used as a voltage-to-time converter, in which the capacitor's discharge time corresponds to the voltage applied to the capacitor. For example, by charging or discharging a capacitor, an analog voltage signal can be converted to a pulse width modulated signal as depicted in FIG. 7. The width of the pulse is linearly proportional to the input voltage.

The converted pulse width modulated signals are fed into an AND gate. As shown in the figure, the output of the AND gate is exactly the shortest pulse.

This shortest pulse is then fed to a time-to-voltage converter, which may optionally be a capacitor, in an exemplary implementation. This capacitor is charged with this shortest pulse, thereby essentially recreating the minimum value from the inputs of the voltage-to-time converters (e.g. a corresponding minimum value among all the input signals). In this manner, a minimum search is implemented.

Figure 8:
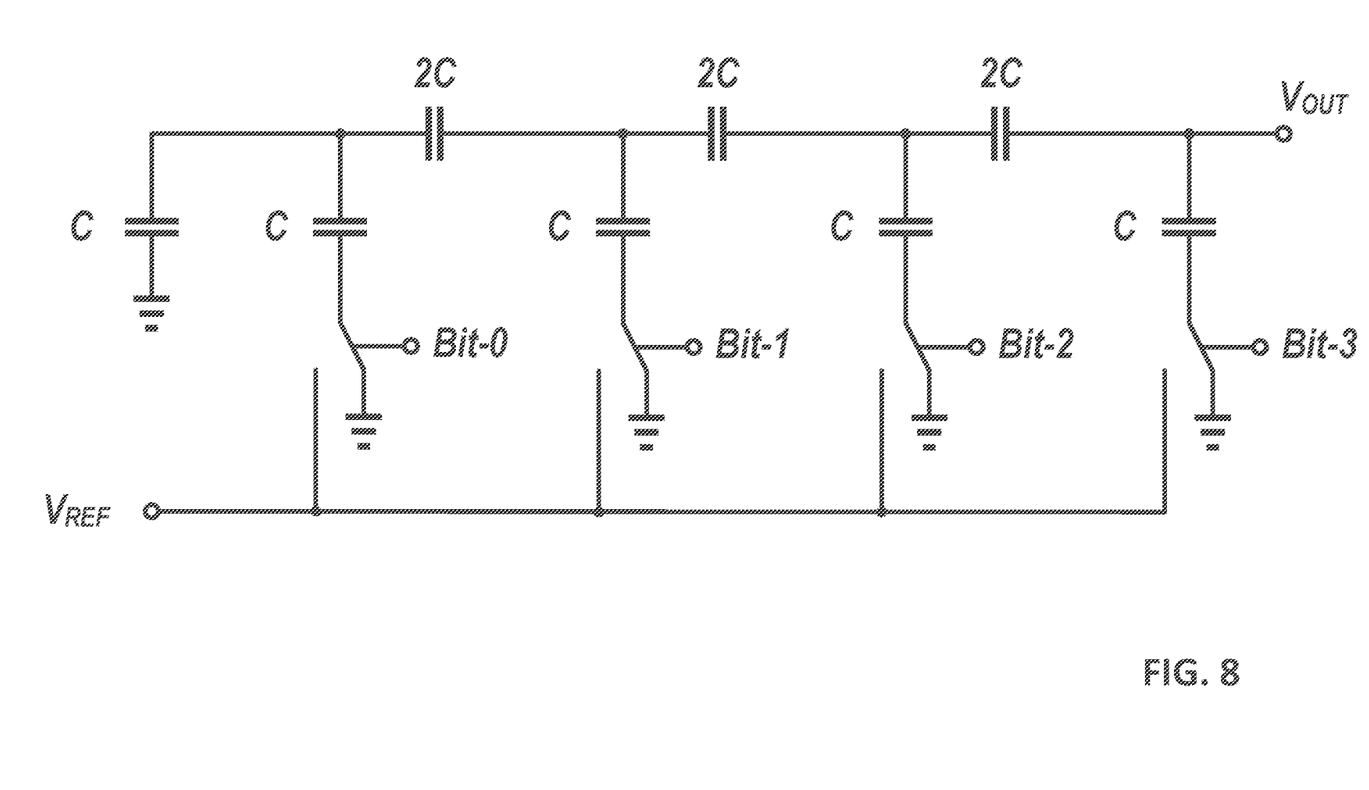
FIG. 8 depicts an analog implementation of a multiplication and accumulation operation.

FIG. 8 depicts an analog implementation of a multiplication and accumulation operation. The multiplication is performed by a structure called C-2C ladder, which is a capacitor network known in digital-to-analog converter (DAC) designs that provides low power analog voltage outputs. As illustrated in FIG. 8, the C-2C ladder includes a series of capacitors segmented into branches. Each branch contains a switch and a capacitor with one unit of capacitance C. A serial capacitor with a capacitance of two units of capacitance 2C is inserted between every two branches. The switches are controlled by digital bits and connected to either a fixed reference voltage (VREF) or a ground node. Due to the serial capacitors, the branches are binarily weighted along the ladder, and their outputs are superimposed onto one another at ladder's output node. As a result, the voltage at the output corresponds to the digital bits applied to those switches with a scaling factor of VREF, as expressed in the following equation:

$$V_{OUT} = V_{REF} \sum_{i=0}^{m-1} B_i \times \frac{1}{2^{m-i}} \quad (1)$$

wherein B is the switches corresponding to the bits, and m is the number of branches in the ladder. The VREF can be replaced by the input signal, than the output would be the product of the input signal and the data applied to those switches on the C-2C ladder.

Figure 9:
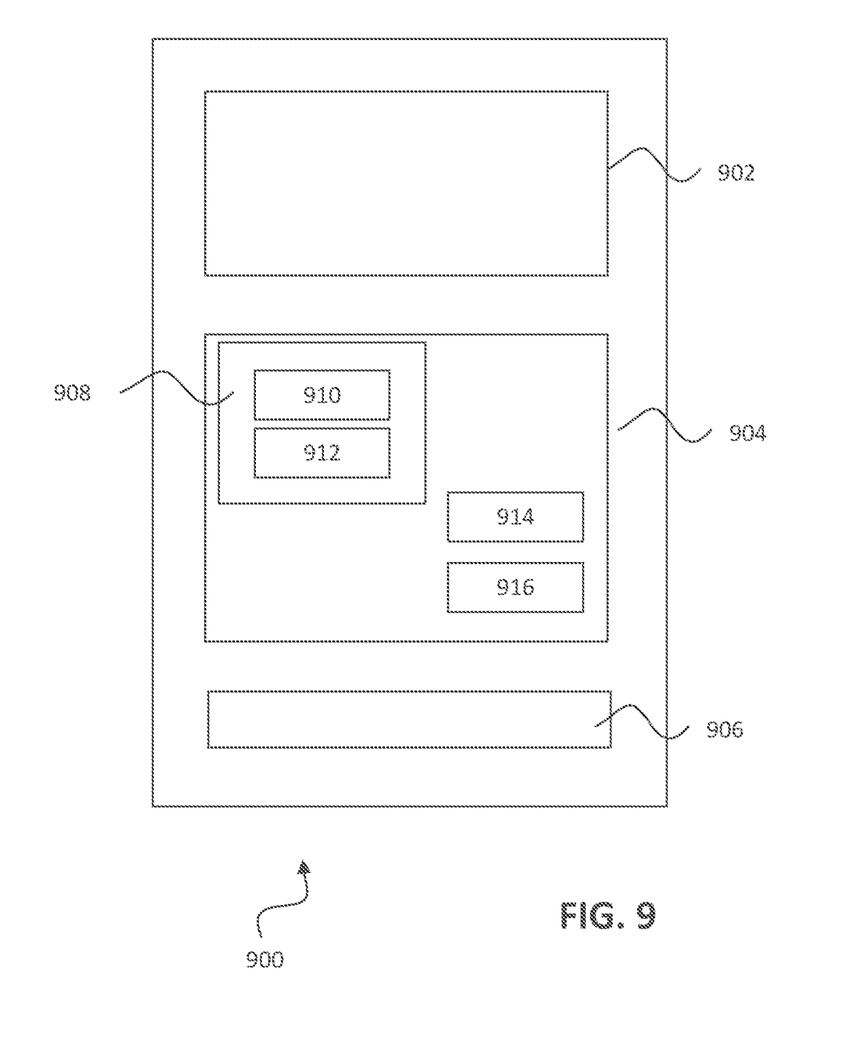
FIG. 9 depicts a functional representation of an analog error correction device.

FIG. 9 depicts a functional representation of an analog error correction device 900, including a radiofrequency frontend 902. The radiofrequency frontend 902 may include one or more antenna, a digital/analog converter, an analog/digital converter, or any of these. The radiofrequency frontend 902 may be configured to wirelessly receive a radiofrequency signal; perform one or more analog baseband operations on the received radiofrequency signal, according to a radio access technology; and output an analog signal representing an output of the analog baseband operations on the received radiofrequency signal; an error corrector 904, configured to perform an error correction operation on the analog signal; and output an error corrected signal in analog domain; and the analog-digital converter 906, configured to convert the error corrected signal to digital domain. The error correction operation may optionally be a forward error correction operation, and the forward error correction operation may optionally include a low-density parity check, a Reed-Solomon Code, a Binary Convolution Code, or a Hamming Code. The error corrector 904 may optionally include a parity checker 908, wherein the parity checker includes a polarity extractor 910 and a bit multiplier 912, and preferably wherein the polarity extractor 910 includes an analog comparator, configured to receive the analog signal, compare the analog signal to a reference signal, and if an instantaneous voltage of the electrical signal is greater than an instantaneous voltage of the reference signal, output a polarity signal representing a positive polarity, and if an instantaneous voltage of the electrical signal is less than an instantaneous voltage of the reference signal, output a polarity signal representing a negative polarity. If the analog signal is a differential signal including a first analog signal and a second analog signal; then the polarity extractor 910 may optionally be configured to receive the first analog signal and the second analog signal, compare the differential signal to a reference signal using the first analog signal and the second analog signal, and if an instantaneous voltage of the differential signal is greater than an instantaneous voltage of the reference signal, output a polarity signal representing a positive polarity, and if an instantaneous voltage of the differential signal is less than an instantaneous voltage of the reference signal, output a polarity signal representing a negative polarity. In combination with any of the above aspects of the disclosure, the error corrector 904 further may optionally include a bit multiplier 912, configured to receive the polarity signal a signal representing a bit; to multiply the polarity signal with the signal representing the bit; and to output a multiplication signal representing the multiplication of the polarity signal with the signal representing the bit. The bit multiplier 912 may optionally include a plurality of exclusive NOR (XNOR) gates, and wherein the bit multiplier multiplying the polarity signal with the signal representing the bit includes processing the signal through the plurality of XNOR gates. In combination with any of the above aspects, the error corrector may further includes a weight generator 914, configured to perform a weight generation operation, wherein the weight generator includes an absolute value extractor and a minimum searcher. The absolute value extractor may be optionally configured to receive the analog signal and to output an absolute value of the analog signal. In combination with any of the above aspects, the error corrector may further include a minimum searcher 916, which may be configured to receive a plurality of input values, and to output as a minimum output value a smallest value of the plurality of input values.

The error corrector may include any, or any combination of, of the analog FEC circuits disclosed herein. The error corrector may include a combination of analog and digital circuits for FEC.

Data Conversion Requirements Alleviation

The FEC scheme disclosed herein not only benefits from the high efficiency analog processing, but also greatly alleviates the burden on ADCs in the aspect of design complexity. To collect enough information for soft decision implementation, a greater number of bits and higher oversampling rate are required in ADC designs, which leads to an ultra-complicated design and unacceptable power consumption. Practically, the required ADC's number of bits (NoB) in soft decision is at least 2 bits larger than the requirement in hard decision implementations. In the analog soft decision FEC scheme described herein, the soft decision data remains in the analog domain during the entire FEC process until majority voting (e.g. until the last step). The processed signal at this step is quantized by an ADC with the same design specs of the one used in hard decision scheme. As a result, both the design complexity and the power consumption are reduced.

Additional aspects of the disclosure are disclosed below by way of example.

In Example 1, the wireless communication device, including a radiofrequency frontend, configured to: wirelessly receive a radiofrequency signal; perform one or more analog baseband operations on the received radiofrequency signal, according to a radio access technology; and output an analog signal representing an output of the analog baseband operations on the received radiofrequency signal; an error corrector, configured to: perform an error correction operation on the analog signal; and output an error corrected signal in analog domain; and the analog-digital converter, configured to convert the error corrected signal to digital domain.

In Example 2, the wireless communication device of Example 1, wherein the error correction operation is a forward error correction operation.

In Example 3, the wireless communication device of Example 2, wherein the forward error correction operation includes a low-density parity check, a Reed-Solomon Code, a Binary Convolution Code, or a Hamming Code.

In Example 4, the wireless communication device of any one of Examples 1 to 3, wherein the error corrector includes a parity checker.

In Example 5, the wireless communication device of Example 4, wherein the parity checker includes a polarity extractor and a bit multiplier.

In Example 6, the wireless communication device of Example 5, wherein the polarity extractor includes an analog comparator, configured to receive the analog signal, compare the analog signal to a reference signal, and if an instantaneous voltage of the electrical signal is greater than an instantaneous voltage of the reference signal, output a polarity signal representing a positive polarity, and if an instantaneous voltage of the electrical signal is less than an instantaneous voltage of the reference signal, output a polarity signal representing a negative polarity.

In Example 7, the wireless communication device of Example 5, wherein the polarity extractor includes an analog comparator and the analog signal is a differential signal including a first analog signal and a second analog signal; wherein the polarity extractor is configured to receive the first analog signal and the second analog signal, compare the differential signal to a reference signal using the first analog signal and the second analog signal, and if an instantaneous voltage of the differential signal is greater than an instantaneous voltage of the reference signal, output a polarity signal representing a positive polarity, and if an instantaneous voltage of the differential signal is less than an instantaneous voltage of the reference signal, output a polarity signal representing a negative polarity.

In Example 8, the wireless communication device of any of Examples 1 to 7, wherein the error corrector further includes a bit multiplier, configured to receive the polarity signal a signal representing a bit; to multiply the polarity signal with the signal representing the bit; and to output a multiplication signal representing the multiplication of the polarity signal with the signal representing the bit.

In Example 9, the wireless communication device of Example 8, wherein the bit multiplier includes a plurality of exclusive NOR (XNOR) gates, and wherein the bit multiplier multiplying the polarity signal with the signal representing the bit includes processing the signal through the plurality of XNOR gates.

In Example 10, the wireless communication device of any one of Examples 1 to 9, wherein the error corrector further includes a weight generator, configured to perform a weight generation operation.

In Example 11, the wireless communication device of Example 10, wherein the weight generator includes an absolute value extractor.

In Example 12, the wireless communication device of Example 10 or 11, wherein the weight generator includes a minimum searcher.

In Example 13, the wireless communication device of Example 11 or 12, wherein the absolute value extractor is configured to receive the analog signal and to output an absolute value of the analog signal.

In Example 14, the wireless communication device of any one of Examples 12 to 13, wherein the absolute value extractor includes a comparator and a multiplexer; wherein the comparator is configured to compare the analog signal to a reference signal and to output a comparison result representing the comparison of the analog signal to the reference signal, and wherein the multiplexer is configured to output an absolute value of the analog signal based on the comparison result.

In Example 15, the wireless communication device of Example 14, wherein the multiplexer is a transmission-gate-based analog multiplexer.

In Example 16, the wireless communication device of any one of Examples 11 to 15, wherein the error corrector further includes a minimum searcher, configured to receive a plurality of input values, and to output as a minimum output value a smallest value of the plurality of input values.

In Example 17, the wireless communication device of Example 16, wherein minimum searcher includes a plurality of Voltage-to-Time Converters (VTCs), an AND gate, and a Time-to-Voltage Converter (TVC); wherein the VTCs are each connected to inputs of the AND gate, and wherein an output of the AND gate is connected to the TVC; wherein each of the VTCs is configured to receive an analog signal, and to convert to a temporal interval corresponding to a magnitude of the respective input analog signal; wherein the AND gate is configured to output an output temporal interval corresponding to a smallest input temporal interval, and wherein the TVC is configured to convert according to the output analog signal.

In Example 18, the wireless communication device of Example 17, wherein the plurality of first VTCs are a plurality of first capacitors, and wherein the plurality of second VTCs are a plurality of second capacitors.

In Example 19, the wireless communication device of any one of Examples 1 to 18, wherein the error corrector further includes a majority voter, configured to perform a majority voting operation.

In Example 20, the wireless communication device of Example 19, wherein the majority voter includes a multiplier and accumulator, configured to perform the majority voting operation, wherein the multiplier and accumulator includes: a plurality of parallel-connected branches, each parallel-connected branch including a capacitor having a first capacitance and a switch, configured to selectively connect the capacitor having the first capacitance to either an input signal of the multiplier and accumulator or a reference voltage; a plurality of capacitors having a second capacitance, each capacitor of the plurality of capacitors having the second capacitance being connected in series with respect to one another between two branches of the plurality of parallel-connected branches; an input, configured to receive the input signal; and an output, configured to output an output signal as a product of the input signal and a value.

In Example 21, the wireless communication device of Example 20, wherein the value is a binary value, and where each switch of the plurality of parallel-connected branches is configured to selectively connect the capacitor based on the value.

In Example 22, the wireless communication device of Example 20 or 21, wherein the input signal includes an output of parity checker and the weight generator.

In Example 23, the wireless communication device of any one of Examples 20 to 22, wherein the analog-digital converter is configured to receive an output of the majority voter and to convert this output into a digital signal.

In Example 24, the wireless communication device of any one of Examples 1 to 23, wherein the radio access technology is a radio access technology according to a 3rd Generation Partnership Project (3GPP) 5G New Radio Standard.

In Example 25, the wireless communication device of any one of Examples 1 to 23, wherein the radio access technology is a radio access technology according to a 6th Generation New Radio (6G) standard.

In Example 26, a wireless communication device, including: a radiofrequency frontend, configured to wirelessly receive a radiofrequency signal and output an analog signal representing the received radiofrequency signal to an error corrector; the error corrector, configured to: perform an error correction operation on the analog signal; and output an error corrected signal in analog domain; and the analog-digital converter, configured to convert the error corrected signal to digital domain.

In Example 27, the wireless communication device of Example 26, wherein the error correction operation is a forward error correction operation.

In Example 28, the wireless communication device of Example 26 or 27, wherein the forward error correction operation includes a low-density parity check, a Reed-Solomon Code, a Binary Convolution Code, or a Hamming Code.

In Example 29, the wireless communication device of any one of Examples 26 to 28, wherein the error corrector includes a parity checker.

In Example 30, the wireless communication device of Example 29, wherein the parity checker includes a polarity extractor and a bit multiplier.

In Example 31, the wireless communication device of Example 30, wherein the polarity extractor includes an analog comparator, configured to receive the analog signal, compare the analog signal to a reference signal, and if an instantaneous voltage of the electrical signal is greater than an instantaneous voltage of the reference signal, output a polarity signal representing a positive polarity, and if an instantaneous voltage of the electrical signal is less than an instantaneous voltage of the reference signal, output a polarity signal representing a negative polarity.

In Example 32, the wireless communication device of Example 30, wherein the polarity extractor includes an analog comparator and the analog signal is a differential signal including a first analog signal and a second analog signal; wherein the polarity extractor is configured to receive the first analog signal and the second analog signal, compare the differential signal to a reference signal using the first analog signal and the second analog signal, and if an instantaneous voltage of the differential signal is greater than an instantaneous voltage of the reference signal, output a polarity signal representing a positive polarity, and if an instantaneous voltage of the differential signal is less than an instantaneous voltage of the reference signal, output a polarity signal representing a negative polarity.

In Example 33, the wireless communication device of any of Examples 26 to 32, wherein the error corrector further includes a bit multiplier, configured to receive the polarity signal a signal representing a bit; to multiply the polarity signal with the signal representing the bit; and to output a multiplication signal representing the multiplication of the polarity signal with the signal representing the bit.

In Example 34, the wireless communication device of Example 33, wherein the bit multiplier includes a plurality of exclusive NOR (XNOR) gates, and wherein the bit multiplier multiplying the polarity signal with the signal representing the bit includes processing the signal through the plurality of XNOR gates.

In Example 35, the wireless communication device of any one of Examples 26 to 34, wherein the error corrector further includes a weight generator, configured to perform a weight generation operation.

In Example 36, the wireless communication device of Example 35, wherein the weight generator includes an absolute value extractor.

In Example 37, the wireless communication device of Example 35 or 36, wherein the weight generator includes a minimum searcher.

In Example 38, the wireless communication device of Example 36 or 37, wherein the absolute value extractor is configured to receive the analog signal and to output an absolute value of the analog signal.

In Example 39, the wireless communication device of any one of Examples 37 to 38, wherein the absolute value extractor includes a comparator and a multiplexer; wherein the comparator is configured to compare the analog signal to a reference signal and to output a comparison result representing the comparison of the analog signal to the reference signal, and wherein the multiplexer is configured to output an absolute value of the analog signal based on the comparison result.

In Example 40, the wireless communication device of Example 39, wherein the multiplexer is a transmission-gate-based analog multiplexer.

In Example 41, the wireless communication device of any one of Examples 36 to 40, wherein the error corrector further includes a minimum searcher, configured to receive a plurality of input values, and to output as a minimum output value a smallest value of the plurality of input values.

In Example 42, the wireless communication device of Example 41, wherein minimum searcher includes a plurality of Voltage-to-Time Converters (VTCs), an AND gate, and a Time-to-Voltage Converter (TVC); wherein the VTCs are each connected to inputs of the AND gate, and wherein an output of the AND gate is connected to the TVC; wherein each of the VTCs is configured to receive an analog signal, and to convert to a temporal interval corresponding to a magnitude of the respective input analog signal; wherein the AND gate is configured to output an output temporal interval corresponding to a smallest input temporal interval, and wherein the TVC is configured to convert according to the output analog signal.

In Example 43, the wireless communication device of Example 42, wherein the plurality of first VTCs are a plurality of first capacitors, and wherein the plurality of second VTCs are a plurality of second capacitors.

In Example 44, the wireless communication device of any one of Examples 26 to 43, wherein the error corrector further includes a majority voter, configured to perform a majority voting operation.

In Example 45, the wireless communication device of Example 44, wherein the majority voter includes a multiplier and accumulator, configured to perform the majority voting operation, wherein the multiplier and accumulator includes: a plurality of parallel-connected branches, each parallel-connected branch including a capacitor having a first capacitance and a switch, configured to selectively connect the capacitor having the first capacitance to either an input signal of the multiplier and accumulator or a reference voltage; a plurality of capacitors having a second capacitance, each capacitor of the plurality of capacitors having the second capacitance being connected in series with respect to one another between two branches of the plurality of parallel-connected branches; an input, configured to receive the input signal; and an output, configured to output an output signal as a product of the input signal and a value.

In Example 46, the wireless communication device of Example 45, wherein the value is a binary value, and where each switch of the plurality of parallel-connected branches is configured to selectively connect the capacitor based on the value.

In Example 47, the wireless communication device of Example 45 or 46, wherein the input signal includes an output of parity checker and the weight generator.

In Example 48, the wireless communication device of any one of Examples 45 to 47, wherein the analog-digital converter is configured to receive an output of the majority voter and to convert this output into a digital signal.

In Example 49, the wireless communication device of any one of Examples 26 to 48, wherein the radio access technology is a radio access technology according to a 3rd Generation Partnership Project (3GPP) 5G New Radio Standard.

In Example 50, the wireless communication device of any one of Examples 26 to 48, wherein the radio access technology is a radio access technology according to a 6th Generation New Radio (6G) standard.

In Example 51, a device, including: a receiver, for wirelessly receiving a radiofrequency signal and output an analog signal representing the received radiofrequency signal to an error corrector; the error corrector, for performing an error correction operation on the analog signal; and outputting an error corrected signal in analog domain; and an analog-digital converter, for converting the error corrected signal to digital domain.

In Example 52, the device of Example 51, wherein the error correction operation is a forward error correction operation.

In Example 53, the device of Example 51 or 52, wherein the forward error correction operation includes a low-density parity check, a Reed-Solomon Code, a Binary Convolution Code, or a Hamming Code.

In Example 54, the device of any one of Examples 51 to 53, wherein the error corrector includes a parity checker.

In Example 55, the device of Example 54, wherein the parity checker includes a polarity extractor and a bit multiplier.

In Example 56, the device of Example 55, wherein the polarity extractor includes an analog comparator, configured to receive the analog signal, compare the analog signal to a reference signal, and if an instantaneous voltage of the electrical signal is greater than an instantaneous voltage of the reference signal, output a polarity signal representing a positive polarity, and if an instantaneous voltage of the electrical signal is less than an instantaneous voltage of the reference signal, output a polarity signal representing a negative polarity.

In Example 57, the device of Example 55, wherein the polarity extractor includes an analog comparator and the analog signal is a differential signal including a first analog signal and a second analog signal; wherein the polarity extractor is configured to receive the first analog signal and the second analog signal, compare the differential signal to a reference signal using the first analog signal and the second analog signal, and if an instantaneous voltage of the differential signal is greater than an instantaneous voltage of the reference signal, output a polarity signal representing a positive polarity, and if an instantaneous voltage of the differential signal is less than an instantaneous voltage of the reference signal, output a polarity signal representing a negative polarity.

In Example 58, the device of any of Examples 51 to 57, wherein the error corrector further includes a bit multiplier, configured to receive the polarity signal a signal representing a bit; to multiply the polarity signal with the signal representing the bit; and to output a multiplication signal representing the multiplication of the polarity signal with the signal representing the bit.

In Example 59, the device of Example 58, wherein the bit multiplier includes a plurality of exclusive NOR (XNOR) gates, and wherein the bit multiplier multiplying the polarity signal with the signal representing the bit includes processing the signal through the plurality of XNOR gates.

In Example 60, the device of any one of Examples 51 to 59, wherein the error corrector further includes a weight generator, configured to perform a weight generation operation.

In Example 61, the device of Example 60, wherein the weight generator includes an absolute value extractor.

In Example 62, the device of Example 60 or 61, wherein the weight generator includes a minimum searcher.

In Example 63, the device of Example 61 or 62, wherein the absolute value extractor is configured to receive the analog signal and to output an absolute value of the analog signal.

In Example 64, the device of any one of Examples 62 to 63, wherein the absolute value extractor includes a comparator and a multiplexer; wherein the comparator is configured to compare the analog signal to a reference signal and to output a comparison result representing the comparison of the analog signal to the reference signal, and wherein the multiplexer is configured to output an absolute value of the analog signal based on the comparison result.

In Example 65, the device of Example 64, wherein the multiplexer is a transmission-gate-based analog multiplexer.

In Example 66, the device of any one of Examples 61 to 65, wherein the error corrector further includes a minimum searcher, configured to receive a plurality of input values, and to output as a minimum output value a smallest value of the plurality of input values.

In Example 67, the device of Example 66, wherein minimum searcher includes a plurality of Voltage-to-Time Converters (VTCs), an AND gate, and a Time-to-Voltage Converter (TVC); wherein the VTCs are each connected to inputs of the AND gate, and wherein an output of the AND gate is connected to the TVC; wherein each of the VTCs is configured to receive an analog signal, and to convert to a temporal interval corresponding to a magnitude of the respective input analog signal; wherein the AND gate is configured to output an output temporal interval corresponding to a smallest input temporal interval, and wherein the TVC is configured to convert according to the output analog signal.

In Example 68, the device of Example 67, wherein the plurality of first VTCs are a plurality of first capacitors, and wherein the plurality of second VTCs are a plurality of second capacitors.

In Example 69, the device of any one of Examples 51 to 68, wherein the error corrector further includes a majority voter, configured to perform a majority voting operation.

In Example 70, the device of Example 69, wherein the majority voter includes a multiplier and accumulator, configured to perform the majority voting operation, wherein the multiplier and accumulator includes: a plurality of parallel-connected branches, each parallel-connected branch including a capacitor having a first capacitance and a switch, configured to selectively connect the capacitor having the first capacitance to either an input signal of the multiplier and accumulator or a reference voltage; a plurality of capacitors having a second capacitance, each capacitor of the plurality of capacitors having the second capacitance being connected in series with respect to one another between two branches of the plurality of parallel-connected branches; an input, configured to receive the input signal; and an output, configured to output an output signal as a product of the input signal and a value.

In Example 71, the device of Example 70, wherein the value is a binary value, and where each switch of the plurality of parallel-connected branches is configured to selectively connect the capacitor based on the value.

In Example 72, the device of Example 70 or 71, wherein the input signal includes an output of parity checker and the weight generator.

In Example 73, the device of any one of Examples 70 to 72, wherein the converter is configured to receive an output of the majority voter and to convert this output into a digital signal.

In Example 74, the device of any one of Examples 51 to 73, wherein the radio access technology is a radio access technology according to a 3rd Generation Partnership Project (3GPP) 5G New Radio Standard.

In Example 75, the device of any one of Examples 51 to 73, wherein the radio access technology is a radio access technology according to a 6th Generation New Radio (6G) standard.

In Example 76, a method of analog forward error correction including wirelessly receiving an analog signal; performing an error correction operation on the analog signal; outputting an error corrected signal in analog domain; and converting the error corrected signal to digital domain.

In Example 77, the method of analog forward error correction of Example 76, wherein the error correction operation is a forward error correction operation.

In Example 78, the method of analog forward error correction of Example 76 or 77, wherein the forward error correction operation includes a low-density parity check, a Reed-Solomon Code, a Binary Convolution Code, or a Hamming Code.

In Example 79, the method of analog forward error correction of any one of Examples 76 to 78, wherein performing the error correction operation includes performing a parity check.

In Example 80, the method of analog forward error correction of Example 79, wherein the parity check includes performing a polarity extraction and a bit multiplication.

In Example 81, the method of analog forward error correction of Example 80, wherein the polarity extraction includes performing an analog comparison, including: receiving the analog signal; comparing the analog signal to a reference signal; and if an instantaneous voltage of the electrical signal is greater than an instantaneous voltage of the reference signal, outputting a polarity signal representing a positive polarity; and if an instantaneous voltage of the electrical signal is less than an instantaneous voltage of the reference signal, outputting a polarity signal representing a negative polarity.

In Example 82, the method of analog forward error correction of any of Examples 76 to 81, wherein the error correction further includes a bit multiplication including: receiving the polarity signal a signal representing a bit; multiplying the polarity signal with the signal representing the bit; and outputting a multiplication signal representing the multiplication of the polarity signal with the signal representing the bit.

In Example 83, the method of analog forward error correction of Example 82, wherein the bit multiplication includes multiplying the polarity signal with the signal representing the bit includes processing the signal through a plurality of XNOR gates.

In Example 84, the method of analog forward error correction of any one of Examples 76 to 83, wherein the error correction further includes performing a weight generation operation.

In Example 85, the method of analog forward error correction of Example 84, wherein the weight generation operation includes extracting an absolute value.

In Example 86, the method of analog forward error correction of Example 84 or 85, wherein the weight generation includes performing a minimum search.

In Example 87, the method of analog forward error correction of Example 85 or 86, wherein the absolute value extraction includes receiving the analog signal and outputting an absolute value of the analog signal.

In Example 88, the method of analog forward error correction of any one of Examples 86 to 87, wherein the absolute value extraction includes: comparing the analog signal to a reference signal; outputting a comparison result representing the comparison of the analog signal to the reference signal; and outputting an absolute value of the analog signal based on the comparison result.

In Example 89, the method of analog forward error correction of any one of Examples 84 to 88, wherein the error correction further includes receiving a plurality of input values and outputting as a minimum output value a smallest value of the plurality of input values.

In Example 90, the method of analog forward error correction of Example 89, wherein minimum search includes a receiving an analog signal; converting the analog signal to a temporal interval corresponding to a magnitude of the respective input analog signal; and outputting a temporal interval corresponding to a smallest input temporal interval; and converting according to the temporal interval.

In Example 91, the method of analog forward error correction of any one of Examples 76 to 90, wherein the error correction further includes a majority voting operation.

While the above descriptions and connected figures may depict components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

What is claimed is:

1. A wireless communication device, comprising:
a radiofrequency frontend, configured to:
wirelessly receive a radiofrequency signal;
perform one or more analog baseband operations on the received radiofrequency signal, according to a radio access technology; and
output an analog signal representing an output of the analog baseband operations on the received radiofrequency signal;
an error corrector, configured to:
perform an error correction operation on the analog signal; and
output an error corrected signal in analog domain; and
an analog-digital converter, configured to convert the error corrected signal to digital domain.

2. The wireless communication device of claim 1, wherein the error correction operation is a forward error correction operation.

3. The wireless communication device of claim 2, wherein the forward error correction operation comprises a low-density parity check, a Reed-Solomon Code, a Binary Convolution Code, or a Hamming Code.

4. The wireless communication device of claim 1, wherein the error corrector comprises a parity checker, and wherein the parity checker comprises a polarity extractor and a bit multiplier.

5. The wireless communication device of claim 4, wherein the polarity extractor comprises an analog comparator, configured to receive the analog signal, compare the analog signal to a reference signal, and if an instantaneous voltage of the analog signal is greater than an instantaneous voltage of the reference signal, output a polarity signal representing a positive polarity, and if an instantaneous voltage of the analog signal is less than an instantaneous voltage of the reference signal, output a polarity signal representing a negative polarity.

6. The wireless communication device of claim 4, wherein the polarity extractor comprises an analog comparator and the analog signal is a differential signal comprising a first analog signal and a second analog signal;
wherein the polarity extractor is configured to receive the first analog signal and the second analog signal, compare the differential signal to a reference signal using the first analog signal and the second analog signal, and if an instantaneous voltage of the differential signal is greater than an instantaneous voltage of the reference signal, output a polarity signal representing a positive polarity, and if an instantaneous voltage of the differential signal is less than an instantaneous voltage of the reference signal, output a polarity signal representing a negative polarity.

7. The wireless communication device of claim 4, wherein the bit multiplier is configured to receive a polarity signal and a signal representing a bit; to multiply the polarity signal with the signal representing the bit; and to output a multiplication signal representing the multiplication of the polarity signal with the signal representing the bit.

8. The wireless communication device of claim 7, wherein the bit multiplier comprises a plurality of exclusive NOR (XNOR) gates, and wherein the bit multiplier multiplying the polarity signal with the signal representing the bit comprises the bit multiplier processing the signal through the plurality of XNOR gates.

9. The wireless communication device of claim 1, wherein the error corrector further comprises a weight generator, configured to perform a weight generation operation.

10. The wireless communication device of claim 9, wherein the weight generator comprises an absolute value extractor and a minimum searcher.

11. The wireless communication device of claim 10, wherein the absolute value extractor is configured to receive the analog signal and to output an absolute value of the analog signal.

12. The wireless communication device of claim 10, wherein the absolute value extractor comprises a comparator and a multiplexer; wherein the comparator is configured to compare the analog signal to a reference signal and to output a comparison result representing the comparison of the analog signal to the reference signal, and wherein the multiplexer is configured to output an absolute value of the analog signal based on the comparison result.

13. The wireless communication device of claim 12, wherein the multiplexer is a transmission-gate-based analog multiplexer.

14. The wireless communication device of claim 9, wherein the error corrector further comprises a minimum searcher, configured to receive a plurality of input values, and to output as a minimum output value a smallest value of the plurality of input values.

15. The wireless communication device of claim 14, wherein minimum searcher comprises a plurality of Voltage-to-Time Converters (VTCs), an AND gate, and a Time-to-Voltage Converter (TVC); wherein the VTCs are each connected to inputs of the AND gate, and wherein an output of the AND gate is connected to the TVC; wherein each of the VTCs is configured to receive an analog signal, and to convert to a temporal interval corresponding to a magnitude of the respective received analog signal; wherein the AND gate is configured to output an output temporal interval corresponding to a smallest input temporal interval, and wherein the TVC is configured to convert according to the output analog signal.

16. The wireless communication device of claim 15, wherein the plurality of VTCs are a plurality of first capacitors, and wherein the TVC is a capacitor.

17. The wireless communication device of claim 1, wherein the error corrector further comprises a majority voter, configured to perform a majority voting operation; wherein the majority voter comprises a multiplier and accumulator, configured to perform the majority voting operation, wherein the multiplier and accumulator comprises:

a plurality of parallel-connected branches, each parallel-connected branch comprising a capacitor having a first capacitance and a switch, configured to selectively connect the capacitor having the first capacitance to either an input signal of the multiplier and accumulator or a reference voltage;

a plurality of capacitors having a second capacitance, each capacitor of the plurality of capacitors having the second capacitance being connected in series with respect to one another between two branches of the plurality of parallel-connected branches;

an input, configured to receive the input signal; and an output, configured to output an output signal as a product of the input signal and a value.

18. The wireless communication device of claim 17, wherein the analog-digital converter is configured to receive an output of the majority voter and to convert this output into a digital signal.

19. The wireless communication device of claim 18, wherein the value is a binary value, and where each switch of the plurality of parallel-connected branches is configured to selectively connect the capacitor based on the value.

20. The wireless communication device of claim 1, wherein the radio access technology is a radio access technology according to a 3rd Generation Partnership Project (3GPP) 5G New Radio Standard or a radio access technology according to a 6th Generation New Radio (6G) standard.

21. A wireless communication device, comprising:

an error corrector, for:

performing an error correction operation on an analog signal representing a received radiofrequency transmission; and outputting an error corrected signal in analog domain; and an analog-digital converter, for converting the error corrected signal to digital domain.

22. The wireless communication device of claim 21, wherein the error correction operation is a forward error correction operation.

23. The wireless communication device of claim 21, wherein the error corrector comprises a parity checker, and wherein the parity checker comprises a polarity extractor and a bit multiplier.

24. The wireless communication device of claim 23, wherein the polarity extractor comprises an analog comparator, configured to receive the analog signal, compare the analog signal to a reference signal, and if an instantaneous voltage of the analog signal is greater than an instantaneous voltage of the reference signal, output a polarity signal representing a positive polarity, and if an instantaneous voltage of the analog signal is less than an instantaneous voltage of the reference signal, output a polarity signal representing a negative polarity; or if the analog signal is a differential signal comprising a first analog signal and a second analog signal, wherein the polarity extractor is configured to receive the first analog signal and the second analog signal, compare the differential signal to a reference signal using the first analog signal and the second analog signal, and if an instantaneous voltage of the differential signal is greater than an instantaneous voltage of the reference signal, output a polarity signal representing a positive polarity, and if an instantaneous voltage of the differential signal is less than an instantaneous voltage of the reference signal, output a polarity signal representing a negative polarity.

* * * * *